United States Patent [19]

Ryum et al.

[11] Patent Number: 5,496,745
[45] Date of Patent: Mar. 5, 1996

[54] METHOD FOR MAKING BIPOLAR TRANSISTOR HAVING AN ENHANCED TRENCH ISOLATION

[75] Inventors: Byung-Ryul Ryum; Tae-Hyeon Han; Soo-Min Lee; Deok-Ho Cho; Seong-Hearn Lee; Jin-Young Kang, all of Daejeon, Rep. of Korea

[73] Assignees: Electronics and Telecommunications Research Institute, Daejeon; Korea Telecommunications Authority, Seoul, both of Rep. of Korea

[21] Appl. No.: 358,825

[22] Filed: Dec. 19, 1994

[51] Int. Cl.⁶ .................................................. H01L 21/265
[52] U.S. Cl. ........................ 437/31; 437/63; 437/67; 437/126; 437/133; 148/DIG. 10; 148/DIG. 11; 148/DIG. 72; 257/183; 257/197; 257/200; 257/586
[58] Field of Search .............................. 437/31, 126, 133, 437/63, 67; 148/DIG. 10, DIG. 11, DIG. 72; 257/183, 197, 200, 586

[56] References Cited

FOREIGN PATENT DOCUMENTS

| 1183155 | 7/1989 | Japan | 257/197 |
|---------|--------|-------|---------|
| 3014240 | 1/1991 | Japan | 257/197 |

*Primary Examiner*—Olik Chaudhuri
*Assistant Examiner*—Long Pham
*Attorney, Agent, or Firm*—Larson and Taylor

[57] ABSTRACT

Disclosed is a fabrication of a bipolar transistor using an enhanced trench isolation so as to improve integration and performance thereof, comprising the steps of sequentially etching back portions corresponding to a trench using a trench forming mask to a predetermined depth of the buried collector to form the trench; filling an isolation insulating layer into the trench; polishing the isolation insulating layer up to a surface of the silicon oxide layer; sequentially forming a second insulating layer on the isolating insulating layer and the silicon oxide layer; removing the first polysilicon layer and the first insulating layer formed on an inactive region other than an active region defined by the trench; thermal-oxidizing the collector layer formed on the inactive region to form a thermal oxide layer; removing the second insulating layer and sequentially forming a third polysilicon, a third insulating layer and a second nitride layer; etching back layers formed on a portion of the first insulating layer to form an opening in the active region; forming a first side wall on both edges of the opening and removing the first insulating layer; forming an intrinsic base at a region where the first insulating layer is removed to electrically connect the intrinsic base with an extrinsic base in self-alignment; forming a second side wall on both sides of the first side wall; and forming an emitter layer on the intrinsic base.

9 Claims, 7 Drawing Sheets

METHOD FOR MAKING BIPOLAR TRANSISTOR HAVING AN ENHANCED TRENCH ISOLATION

BACKGROUND OF THE INVENTION

1. Field of the Invention

The present invention relates to fabrication of a semiconductor device, and more particularly to a method for making a bipolar transistor using an enhanced trench isolation so as to improve integration and performance thereof.

2. Description of the Prior Art

To improve operation characteristics of a semiconductor device, several types of hetero-junction bipolar transistors have been actively developed. Typical one of them has a SiGe base which is substituted for a silicon base, and utilizes characteristics of narrowing in energy band gap and grading dependently upon Ge content of the SiGe base.

Similarly to a conventional homo-junction transistor, such a hetero-junction bipolar transistor uses a polysilicon as a component material constituting an extrinsic base and an emitter electrode in addition of an impurity diffusing source of the emitter electrode, and a SiGe material as a component material constituting an intrinsic base, thereby allowing an emitter injection efficiency to be increased. Also, in the bipolar transistor, because the intrinsic base is composed of an ultra-thin layer doped with an impurity of high concentration, a current gain and a switching speed thereof can be improved.

As integration of a semiconductor device is improved higher, i.e. as a semiconductor device is scaled down in size, a selective epitaxy growth is developed to form an epitaxial thin film and also it has been actively researched that a metallic silicide film, for example a $TiSi_2$ film, in place of a polysilicon film is used as a thin film for base electrode.

FIG. 1 shows the construction of a prior art n-p-n type hetero-junction bipolar transistor in which a SiGe intrinsic base is fabricated by a super self-aligned and selective epitaxy grown.

Fabrication of the bipolar transistor will be briefly described below with reference to FIG. 1.

First, after sequential formation of an $n^+$ subcollector 2 and an $n^-$ collector 3 on a silicon substrate 1, a trench isolation is performed to form a trench and then an insulating material is filled into the trench to form an isolation insulating layer 4.

Next, a patterned insulating layer 5, a $p^+$ polysilicon layer 6, an insulating layer 7 and a side nitride layer 8 are sequentially formed thereon to define an n type collector region 9, and then an impurity is selectively implanted into the n type collector region 9. The $p^+$ polysilicon layer 6 is provided to serve as a base electrode thin film.

Subsequently, on a defined active region, an intrinsic SiGe base 10 is formed by a gas source MBE (molecular beam epitaxy), and a polysilicon layer 11 is formed by a selective epitaxy grown. The polysilicon layer 11 is provided to electrically connect the $p^+$ polysilicon layer 6 with the SiGe base 10. Thus, a region occurring a parasitic capacitance between the collector and the base is restricted only by the polysilicon layer 11.

Finally, after formation of a side wall insulating layer 12 at the intrinsic SiGe base, an emitter 13 is formed in self-alignment and electrodes 15 are formed by metallization. As a result, the hetero-junction bipolar transistor of FIG. 1 is fabricated.

As described in the above-mentioned prior art method, the intrinsic base 10 is composed of a SiGe material, thereby allowing an emitter injection efficiency to be increased. Additionally, the collector and the base are self-aligned and the emitter and the base also are self-aligned.

Furthermore, because a parasitic capacitance occurring region is limited to a pattern region constituted by the side nitride layer 8 and the side wall insulating layer 12, a parasitic resistance of the base can be reduced by adjustment of the thickness of the pattern region.

However, since the parasitic capacitance region between the collector and the base is defined by a pattern of the polysilicon layer 11 using a lateral wet-etching, stability of the definition process is lowered in the uniformity aspect or the reproduction aspect, so that such a bipolar transistor may be degraded in performance.

In the prior art method, also, since a selective epitaxy grown, which is extremely slowly carried out, is utilized two times in order to form the base 10 and the polysilicon layer 11 and component materials of the base and polysilicon layer are different from each other, the fabrication sequence is complicated and a yield of production is seriously lowered.

In addition, if a polysilicon is grown even only a very little on the ultra-thin base 10, the bipolar transistor suffers a seriously bad influence, so that it may be mal-operated.

SUMMARY OF THE INVENTION

It is an object of the present invention to provide a method for making a bipolar transistor in which integration and performance thereof can be enhanced using an enhance trench isolation.

According to the aspect of the present invention, the method for making a bipolar transistor comprising the steps of sequentially etching back portions corresponding to a trench using a trench forming mask to a predetermined depth of the buried collector to form the trench; filling an isolation insulating layer into the trench; polishing the isolation insulating layer up to a surface of the silicon oxide layer; sequentially forming a second insulating layer on the isolating insulating layer and the silicon oxide layer; removing the first polysilicon layer and the first insulating layer formed on an inactive region other than an active region defined by the trench; thermal-oxidizing the collector layer formed on the inactive region to form a thermal oxide layer; removing the second insulating layer and sequentially forming a third polysilicon, a third insulating layer and a second nitride layer; etching back layers formed on a portion of the first insulating layer to form an opening in the active region; forming a first side wall on both edges of the opening and removing the first insulating layer; forming an intrinsic base at a region where the first insulating layer is removed to electrically connect the intrinsic base with an extrinsic base in self-alignment; forming a second side wall on both sides of the first side wall; and forming an emitter layer on the intrinsic base.

In this method, the insulating layer has a thickness of from 300 to 500 Å, and the first polysilicon layer has about 2000 Å in thickness, and wherein each thickness of the second polysilicon layer and the nitride layer is determined dependently on a polishing selection rate of the trench depth to the isolation insulating layer.

In this method, the isolation insulating layer is composed of one of $Si_3N_4$, $SiO_2$ and a silica glass containing boron and phosphorous.

In this method, the emitter layer is composed of a single-layer polysilicon layer doped with an impurity having high concentration of $1 \times 10^{20} cm^{-3}$ or more.

In this method, the emitter layer is composed of a multi-layer structure, the multi-layer structure being composed of a lower layer composed of a single crystal silicon of $10^{18} cm^{-3}$ or less and an upper layer formed on the lower layer and composed of a polysilicon doped with an impurity having high concentration of $1 \times 10^{20} cm^{-3}$ and more.

According to another aspect of the present invention, the method for making a bipolar transistor comprising the steps of injecting an impurity into a silicon substrate to form a conductive buried collector; forming a collector layer over the silicon substrate; sequentially forming a first insulating layer, a first polysilicon layer, a silicon oxide layer, a first nitride layer and a second polysilicon layer on the collector layer; defining active and inactive regions using a patterned photoresist layer formed on the second polysilicon layer; removing layers formed on the first polysilicon layer of the inactive region; forming a side wall nitride layer at both sides of the layers formed on the active region; depositing a second insulating layer thereon; removing the side wall nitride layer and performing an etching to form a trench; filling an isolation insulating layer into the trench; polishing the isolation insulating layer up to a surface of the silicon oxide layer; sequentially forming a second insulating layer on the isolating insulating layer and the silicon oxide layer; removing the first polysilicon layer and the first insulating layer formed on an inactive region other than an active region defined by the trench; thermal-oxidizing the collector layer formed on the inactive region to form a thermal oxide layer; removing the second insulating layer and sequentially forming a third polysilicon, a third insulating layer and a second nitride layer; etching back layers formed on a portion of the first insulating layer to form an opening in the active region; forming a first side wall on both edges of the opening and removing the first insulating layer; forming an intrinsic base at a region where the first insulating layer is removed to electrically connect the intrinsic base with an extrinsic base in self-alignment; forming a second side wall on both sides of the first side wall; and forming an emitter layer on the intrinsic base.

In this method, the isolation layer is composed of one of $Si_3N_4$, a polyimide and a silica glass containing boron and phosphorous.

In this method, the emitter layer is composed of a single-layer polysilicon layer doped with an impurity having high concentration of $1 \times 10^{20} cm^{-3}$ or more.

In this method, the emitter layer is composed of a multi-layer structure, the multi-layer structure being composed of a lower layer composed of a single crystal silicon of $10^{18} cm^{-3}$ or less and an upper layer formed on the lower layer and composed of a polysilicon doped with an impurity having high concentration of $1 \times 10^{20} cm^{-3}$ more.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 2:
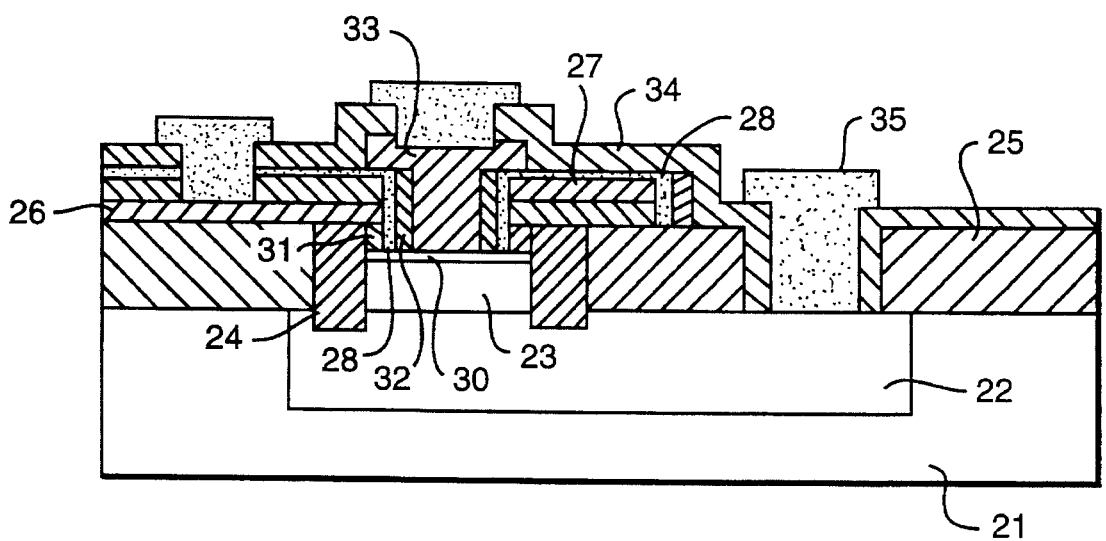
FIG. 2 is a cross-sectional view showing the construction of a bipolar transistor which is fabricated in accordance with a making method of the present invention.

FIG. 2 shows the construction of the bipolar transistor which is fabricated in accordance with the making method of the present invention.

The bipolar transistor of FIG. 2 has a silicon substrate 21 provide with a buried collector 22 therein, a collector 23 defined by trenches filled with an insulating layer, an intrinsic base 30 formed on the collector 23, an extrinsic base 26 electrically isolated from the silicon substrate 21 with a thermal-oxide layer 25 interposed therebetween, a conductive polysilicon layer 31 formed in self-alignment to electrically connect the intrinsic base with the extrinsic base, and an emitter formed on a portion of the intrinsic base and composed of a polysilicon doped with an impurity.

In the method for making the bipolar transistor of FIG. 2, integration of the bipolar transistor can be increasingly improved because a lateral area of the trench is increased in proportion to depth of the trench.

Also, the number of the trench can be reduced because overall collector region other than the active region is thermal-oxidized.

Figure 1:
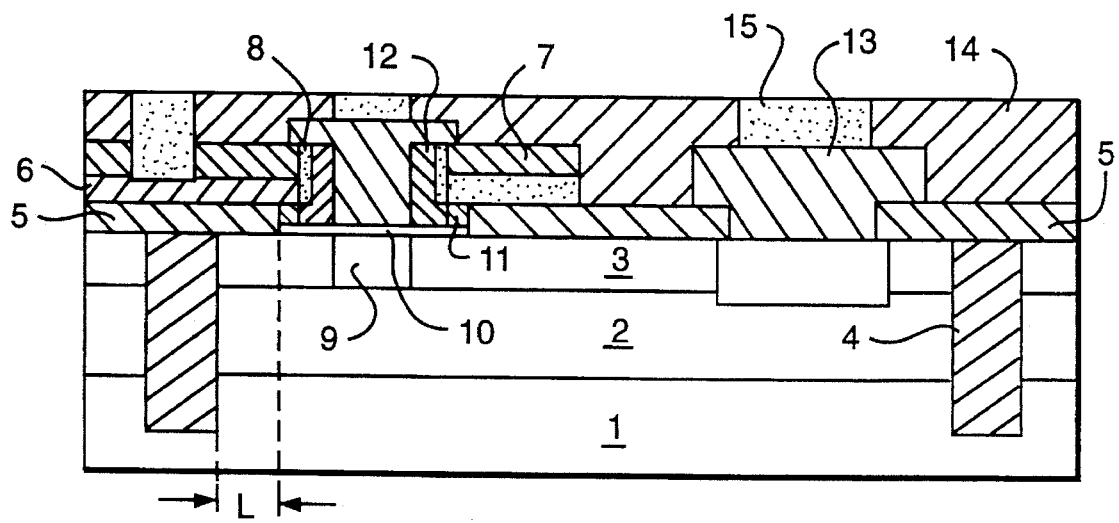
FIG. 1 is a cross-sectional view showing the construction of a hetero-junction bipolar transistor which is fabricated in accordance with a prior art fabrication method.

In the method of the present invention, since none of an isolation insulating layer 4 produced by a prior art trench isolation (as shown in FIG. 1) and an insulating layer 5 to define an active region are necessary, the bipolar transistor can be reduced in size and a parasitic capacitance occurring between the subcollector and the substrate can be reduced.

In addition, thickness of an insulating layer to define the intrinsic and extrinsic bases 30, 26 can be arbitrarily controlled equally to that of the shallow trench, thereby allowing a parasitic capacitance of a metal interconnection to be reduced.

The emitter, base and collector all are formed in self-alignment, whereby the fabrication sequence of the bipolar transistor can be simplified.

Referring to 3A, in a silicon substrate 21, an n⁻ type impurity is ion-implanted, and then an annealing process is carried out to form a conductive buried collector 22 in the silicon substrate 21. Next, a collector layer 23 is formed over the silicon substrate 21.

Figure 3A:
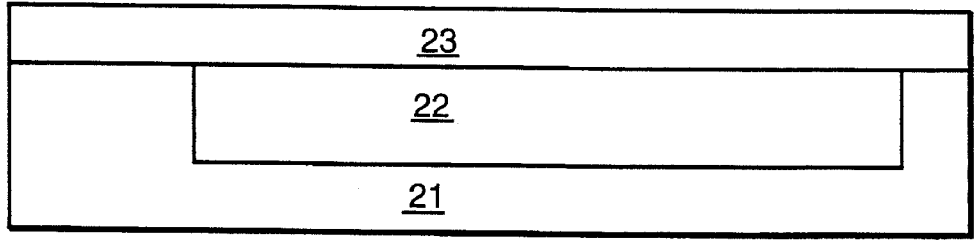
FIGS. 3A to 3N are cross-sectional views showing the steps of the making method of the bipolar transistor of FIG. 2 according to one embodiment of the present invention.
Figure 3B:
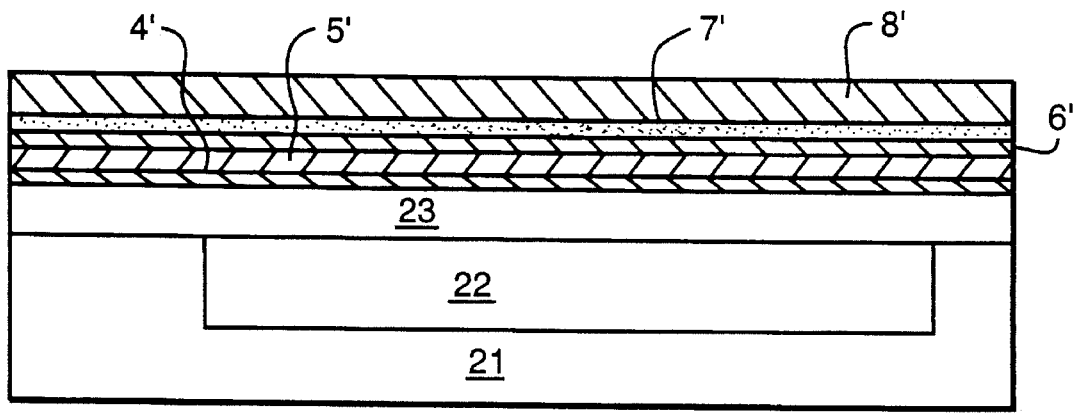

As shown in FIG. 3B, on the collector layer 23, several layers, i.e. an insulating layer 4', a first polysilicon layer 5', a silicon oxide layer 6', a nitride layer 7' and a second polysilicon layer 8' are sequentially formed. Then, the insulating layer 4' has a thickness of from 300 to 500 Å, and the first polysilicon layer 5' has about 2000 Å in thickness.

Particularly, each thickness of the second polysilicon layer 8' and the nitride layer 7' is determined dependently on a polishing selection rate of a trench depth to an isolation insulating layer to be formed by following process.

Figure 3C:
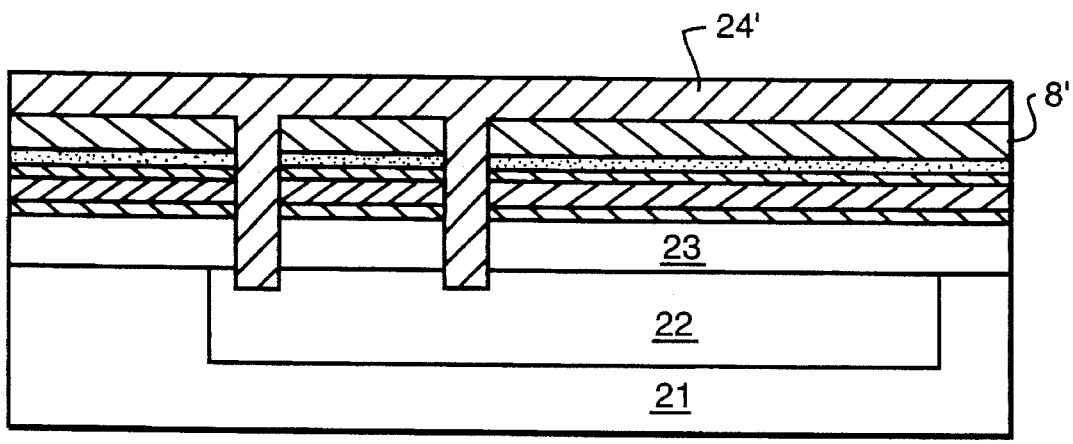

In FIG. 3C, an etching process is performed using a trench forming mask to form a trench. In detail, after definition of an active region using the trench mask, portions corresponding to the trench are sequentially etched back to a predetermined depth of the buried collector 22. It can be seen that the depth of the trench shown in FIG. 3C is different from that of the trench shown in FIG. 1. The trench of FIG. 3C is formed to a certain depth of the buried layer 22, but the trench of FIG. 1 is formed to a certain depth of the silicon substrate 1.

Also, an isolation insulating layer 24' is filled into the trench and formed on the second polysilicon layer 8'. The isolation insulating layer 24' is composed of one of $Si_3N_4$, $SiO_2$ and a silica glass containing boron and phosphorous (BPSG).

Figure 3D:
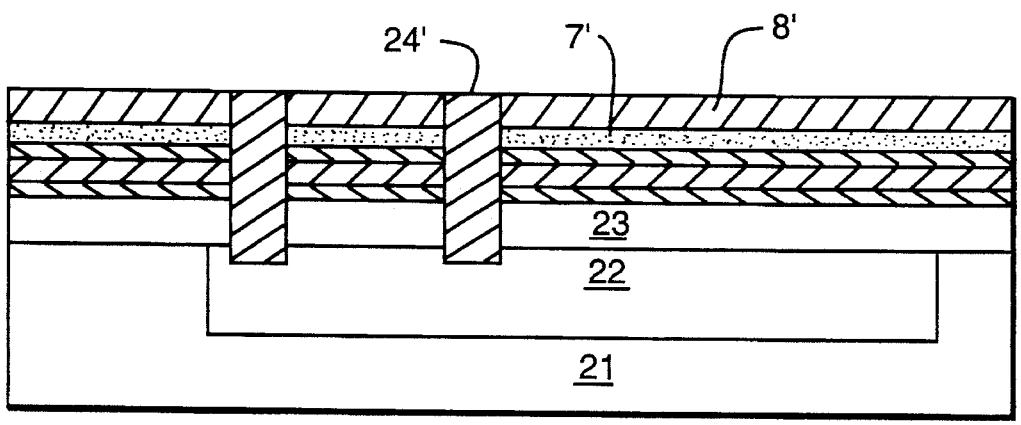

With reference to FIG. 3D, a chemical-mechanical polishing of the isolation insulating layer 24' is carried out until a surface of the second polysilicon layer 8' is exposed. Then, the second polysilicon layer 8' is used as a polishing stopper.

Figure 3E:
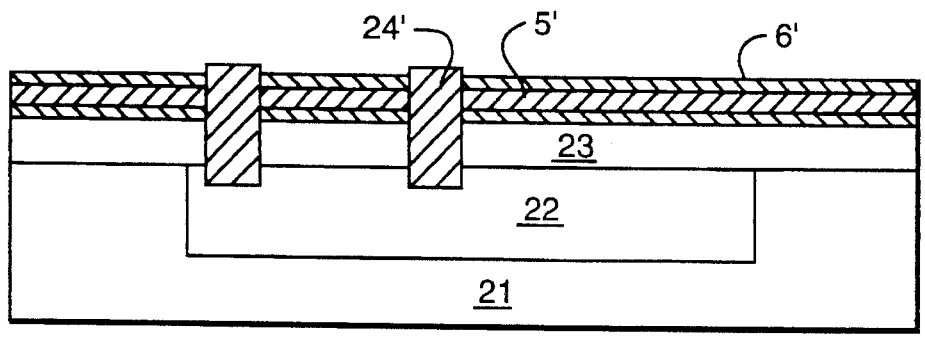

Subsequently, as shown in FIG. 3E, after removal of the exposed second polysilicon layer 8' using a dry-etching or a wet-etching, a planarization of the isolation insulating layer 24' is carried out by the chemical-mechanical polishing using the nitride layer 7' as a polishing stopper. The nitride layer 7' also is removed as shown in FIG. 3E.

Figure 3F:
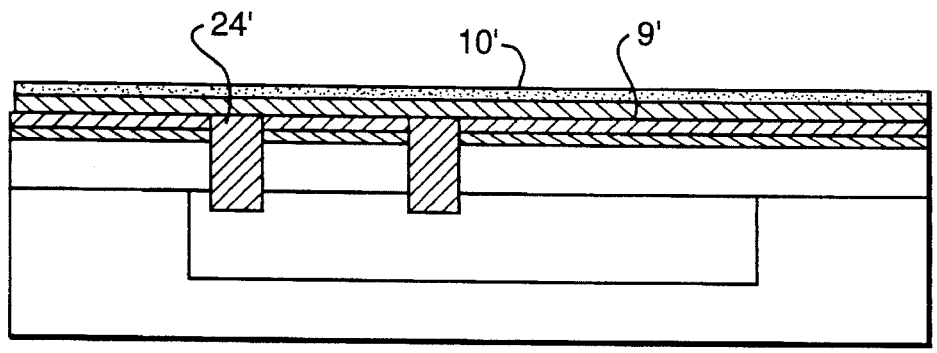

In addition, on the silicon oxide layer 6' and the isolation insulating layer 24', a double-layer insulating layer 9', 10' is deposited, as shown in FIG. 3F. The double-layer insulating layer is provided to protect the active region from getting damaged due to following thermal-oxidation.

Figure 3G:
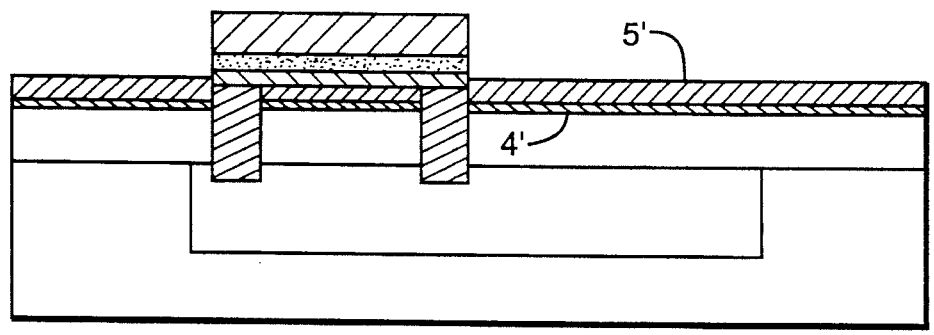
Figure 3H:
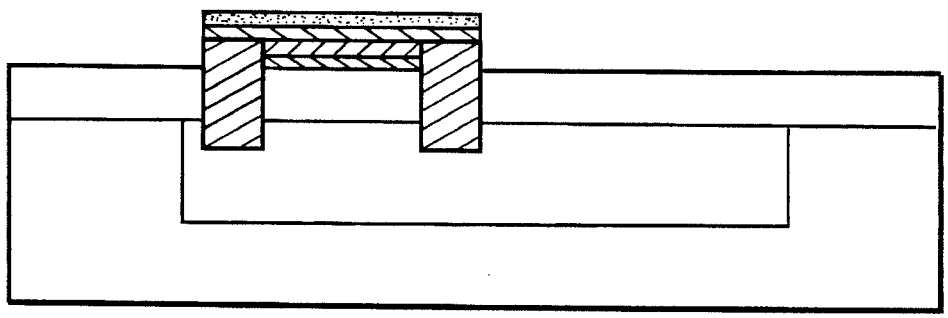

After formation of a patterned photoresist layer only on the active region defined by trenches, the double-layer insulating layer, the first polysilicon layer 5' and the insulating layer 4', which are formed on an inactive region, are sequentially removed as shown in FIGS. 3G and 3H.

Figure 3I:
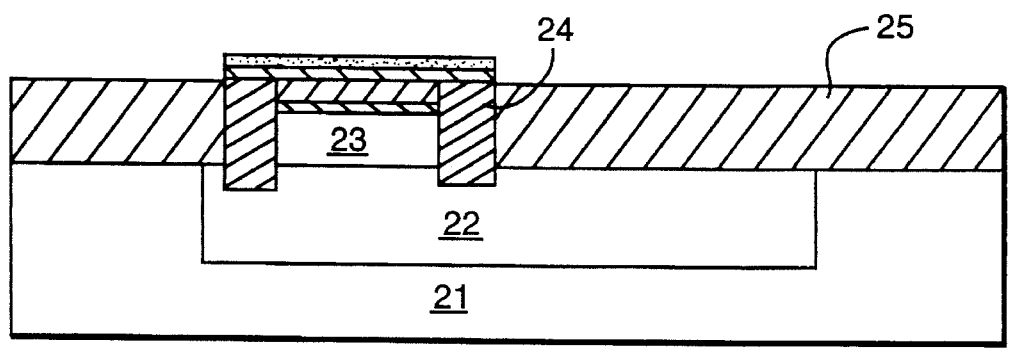

Next, as shown in FIG. 3I, a thermal-oxidation is performed to a thermal oxide layer 25. The thermal oxide layer 25 is formed by oxidation of the collector layer 23 during the thermal-oxidation. The collector layer 23 within the active region defined by the isolation insulating layer 24 is not oxidized because of the double-layer insulating layer and the isolation insulating layer.

Figure 3J:
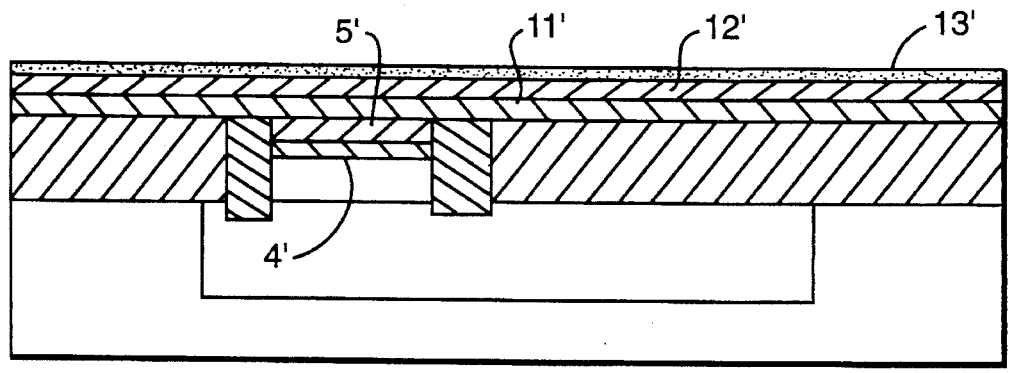

After removal of the double-layer insulating layer formed only the active region, as shown in FIG. 3J, a third polysilicon layer 11' doped with an impurity, an insulating layer 12' and a nitride layer 13' are sequentially formed thereon.

Figure 3K:
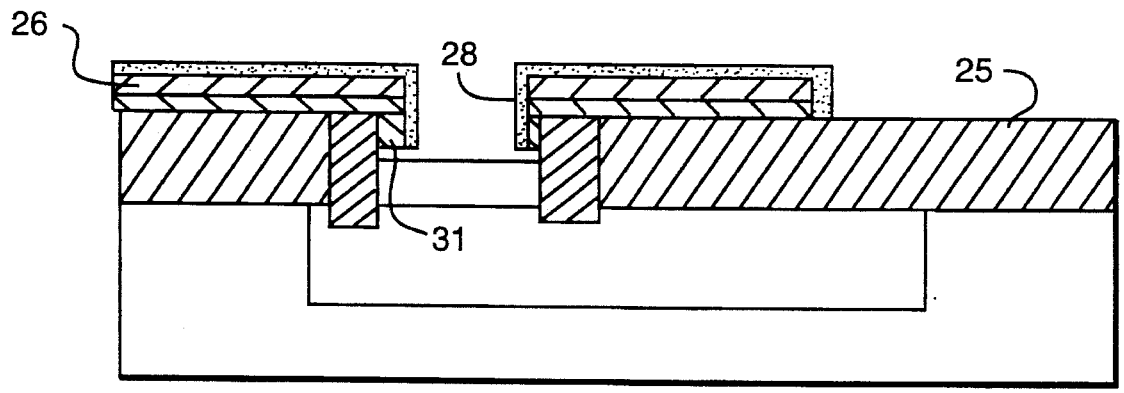
Figure 3L:
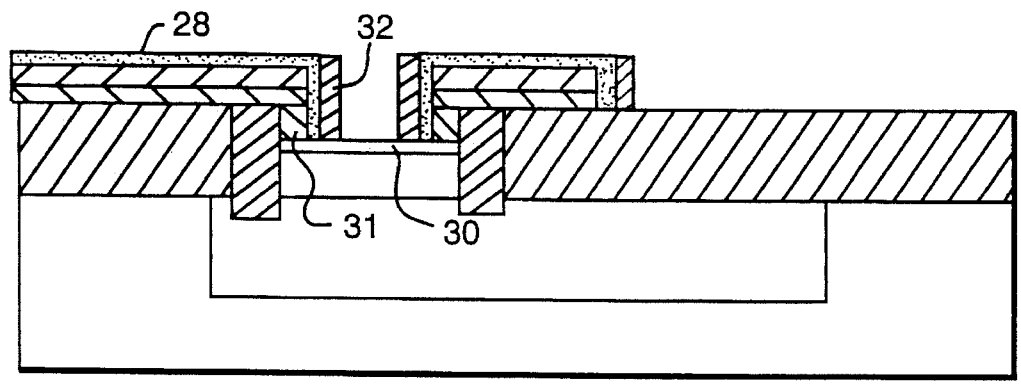

In FIG. 3K, a patterning is performed to define a portion of the active region, and then an etching is carried out to remove several layers formed on the insulating layer 4' within the portion of the active region. Then, a first side wall 28 of a nitride layer is formed on both sides of the removed portion to define an extrinsic base 26, and the insulating layer 4' is removed to form an intrinsic base 31, as shown in FIG. 3K. At the same time, a connecting polysilicon layer 31 is formed in self-alignment to electrically connect the extrinsic base 26 with the intrinsic base 30.

As shown in FIG. 3I, the intrinsic base 31 is formed at a region where the nitride layer 4' is removed, and then a second side wall 32 is formed on the first side wall 28 to define an emitter region.

Figure 3M:
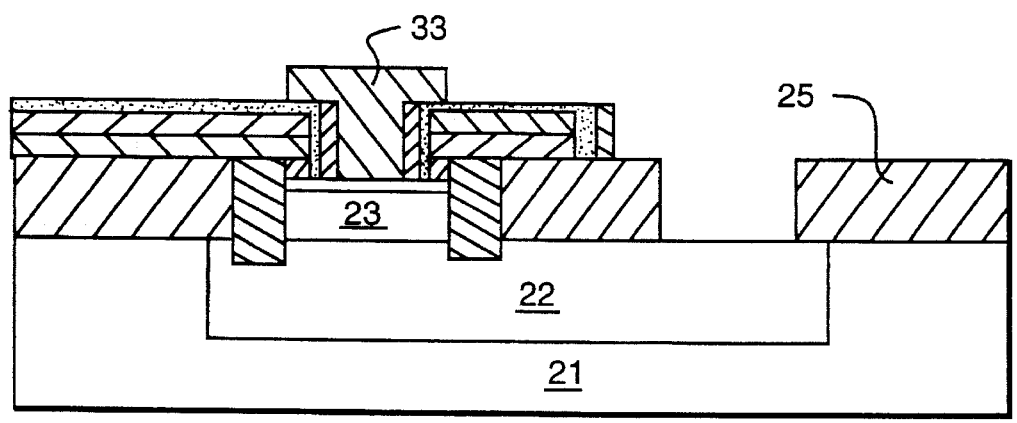

Also, a conductive polysilicon layer of a single layer is deposited on the intrinsic base 30 to form the emitter 33, as shown in FIG. 3M. The conductive polysilicon layer is doped with an impurity having high concentration, i.e. $1 \times 10^{20} cm^{-3}$ or more.

On the other hand, the emitter is composed of a multi-layer structure, which has a lower layer composed of a single crystal silicon of $10^{18} cm^{-3}$ or less and an upper layer formed on the lower layer and composed of a polysilicon doped with an impurity having high concentration of $1 \times 10^{20} cm^{-3}$ and more, in place of the single-layer conductive polysilicon layer.

Figure 3N:
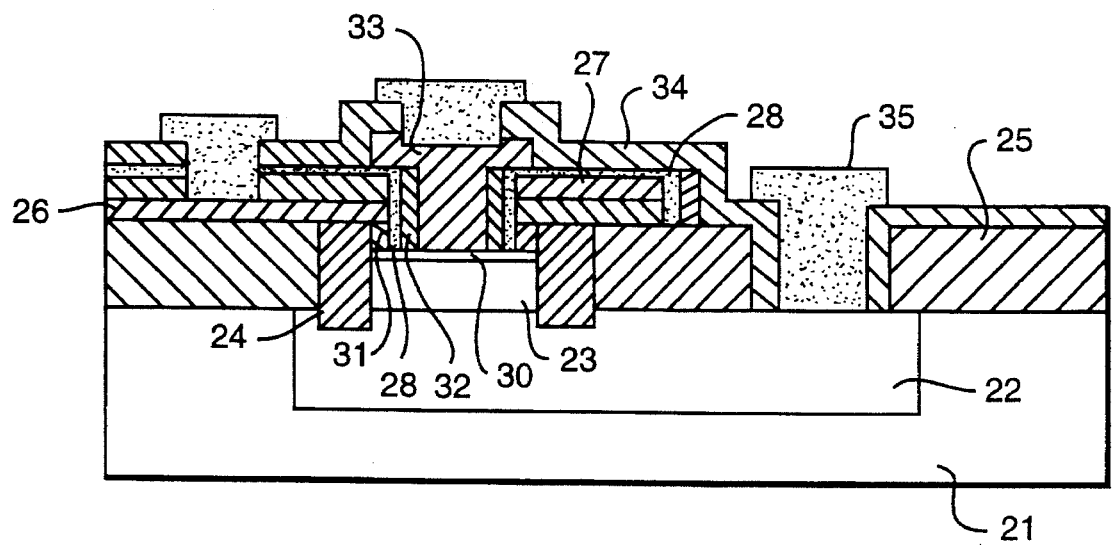

Finally, as shown in FIG. 3N, electrodes 35 are formed through respective contact holes.

Hereinafter, the making method of the bipolar transistor of FIG. 2 according to another embodiment of the present invention will be described with reference to FIGS. 4A to 4H. Component elements having similar functions to the component elements of the bipolar transistor fabricated in accordance with the first embodiment (shown in FIGS. 3A to 3N) are indicated by the same reference numerals, and descriptions thereof are omitted.

In the making method of the first embodiment, the active region is defined by a trench etching process using a trench mask. In the making method of the second embodiment, differently from the first embodiment, an active region is defined by a relatively shallow trench, which is formed by a side wall nitride layer.

Referring to 4A, which is similar to FIG. 3A, in a silicon substrate 21, an n– type impurity is ion-implanted, and then an annealing process is carried out to form a conductive buried collector 22 in the silicon substrate 21. Next, a collector layer 23 is formed over the silicon substrate 21.

Figure 4A:
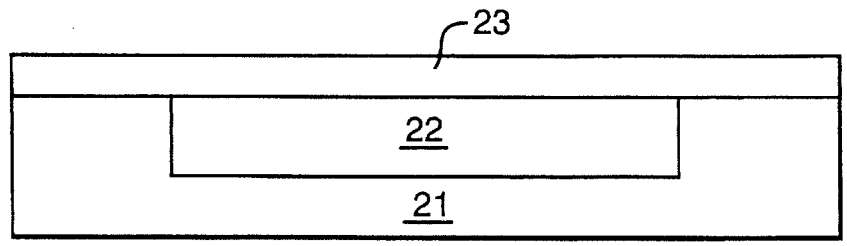
FIGS. 4A to 4H are cross-sectional views showing the steps of the making method of the bipolar transistor of FIG. 2 according to another embodiment of the present invention.
Figure 4B:
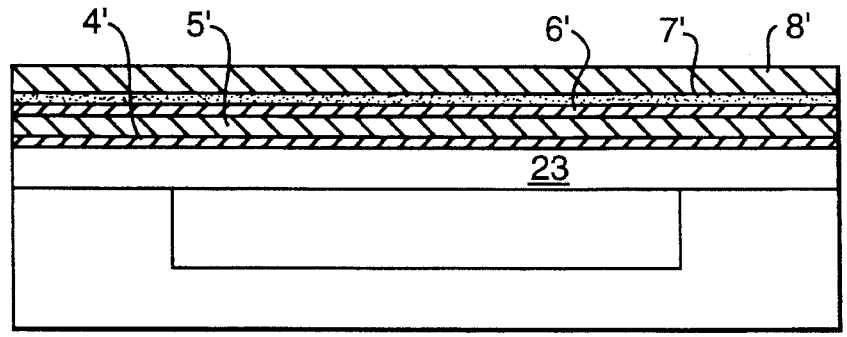

As shown in FIG. 4B, on the collector layer 23, several layers, i.e. an insulating layer 4', a first polysilicon layer 5', a silicon oxide layer 6', a nitride layer 7' and a second polysilicon layer 8' are sequentially formed. Then, the insulating layer 4' has a thickness of from 300 to 500 Å, and the first polysilicon layer 5' has about 2000 Å in thickness.

Particularly, each thickness of the second polysilicon layer 8' and the nitride layer 7' is determined dependently on a polishing selection rate of a trench depth to an isolation insulating layer to be formed by following process.

Figure 4C:
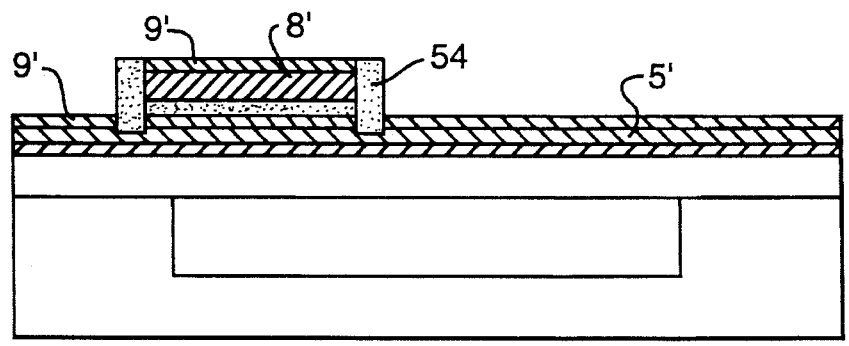

In FIG. 4C, active and inactive regions are defined by a patterned photoresist layer (not shown) formed on the second polysilicon layer 8', several layers on the first polysilicon layer 5' of the inactive region are removed. Next, after deposition of a nitride layer thereon, a patterning is performed to form a side wall nitride layer 54, and a silicon oxide layer 9' as an insulating layer is selectively formed on an exposed surface of the first polysilicon layer 5' and on the second polysilicon layer 8'.

Width of a trench to be formed by following process is determined dependently on that of the side wall nitride layer 54, and depth of the trench is determined dependently on that of the several layers formed on the collector 23.

Figure 4D:
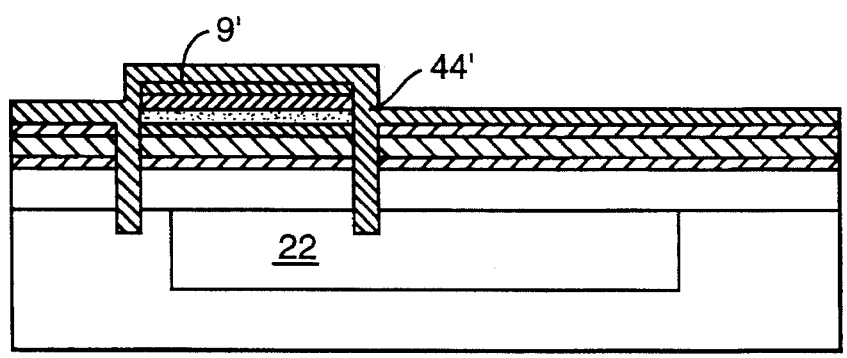

With reference to FIG. 4D, after removal of the side wall nitride layer 54, an etching process is performed using a pattern of the removed side wall nitride layer 54 as a trench forming mask to form a trench. Then, portions corresponding to the trench are sequentially etched back to a predetermined depth of the buried collector 22.

Similarly to the first embodiment, it can be seen that the depth of the trench shown in FIG. 4D is different from that of the trench shown in FIG. 1. The trench of FIG. 4D is formed to a certain depth of the buried layer 22, but the trench of FIG. 1 is formed to a certain depth of the silicon substrate.

Also, an insulating layer 44' is filled into the trench and formed on the silicon oxide layer 9. The isolation layer 44' is composed of one of $Si_3N_4$, a polyimide and a silica glass containing boron and phosphorous (BPSG).

Figure 4E:
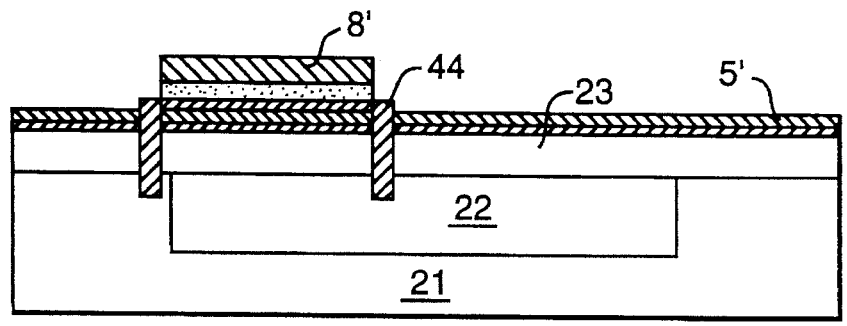

With reference to FIG. 4E, the silicon oxide layer 9' and the insulating layer 44 are removed by an etching.

Figure 4F:
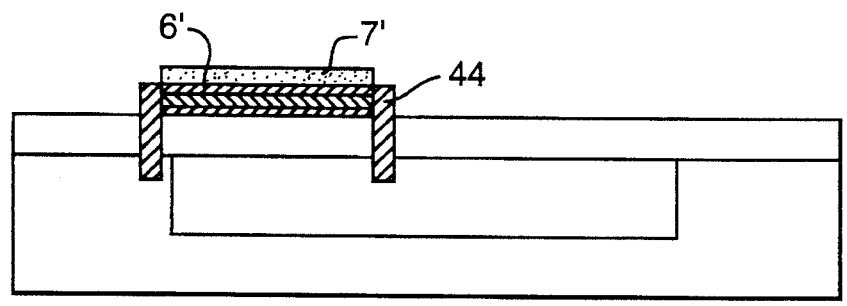

Next, as shown in FIG. 4F, the polysilicon layers 5', 8' of the active and inactive regions are removed.

Figure 4G:
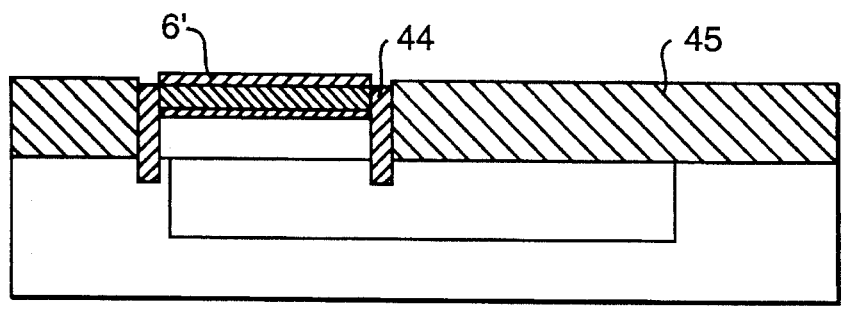
Figure 4H:
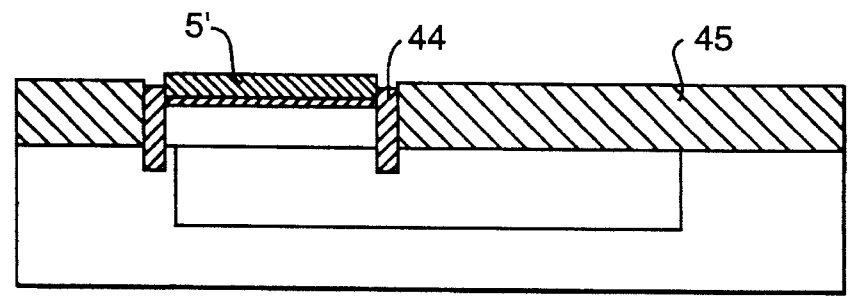

A thermal-oxidation is performed to oxidize the collector 23 of the inactive region, so that a thermal oxide layer 45 can be formed as shown in FIG. 4G.

In this embodiment, since thickness of the thermal oxide layer 45 can be arbitrarily controlled equally to depth of the trench, a parasitic capacitance occurring during metallization can be reduced.

Following processes in the second embodiment are identical with the steps of FIGS. 3I to 3N of the first embodiment, and their descriptions are omitted.

As described above, according to the making method of a bipolar transistor of the present invention, an active region is defined using a shallow trench, thereby allowing its fabrication sequence to be simplified.

Also, by the making method, an isolating region is reduced in width, thereby allowing integration and a yield of production to be increasingly improved.

Furthermore, because a junction capacitance between emitter and base or between base and collector is minimized, operation characteristics of the bipolar device can be enhanced in the high-frequency band thereof.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method of making a bipolar transistor comprising the steps of:

providing a buried collector;

providing a collector above the buried collector;

forming a silicon oxide layer above the buried collector;

using a trench forming mask to form a trench to a predetermined depth of the buried collector;

filling a first insulating layer into the trench;

polishing the first insulating layer to a surface of the silicon oxide layer;

sequentially forming a second insulating layer on the first insulating layer and the silicon oxide layer;

removing the first insulating layer formed on an inactive region other than an active region defined by the trench;

thermal-oxidizing the collector layer formed on the inactive region to form a thermal oxide layer;

removing the second insulating layer and sequentially forming a polysilicon layer, a third insulating layer and a nitride layer;

etching layers formed on a portion of the first insulating layer to form an opening defined by edges in the active region;

forming a first side wall on the edges of the opening and removing the first insulating layer;

forming an intrinsic base at a region where the first insulating layer is removed to electrically connect the intrinsic base with an extrinsic base in self-alignment;

forming a second side wall on the edges of the first side wall; and forming an emitter layer on the intrinsic base.

2. The method according to claim 1, wherein the insulating layer has a thickness of from 300 to 500 Å, and the polysilicon layer has about 2000 Å in thickness, and wherein the thickness of the polysilicon layer and the nitride layer is determined depending on a polishing selection rate of the trench depth to the first insulating layer.

3. The method according to claim 1, wherein the first insulating layer is comprised of one of $Si_3N_4$, $SiO_2$ and a silica glass containing boron and phosphorous.

4. The method according to claim 1, wherein the emitter layer is comprised of a single-layer polysilicon layer doped with an impurity having high concentration of $1\times10^{20}cm^{-3}$ or more.

5. The method according to claim 1, wherein the emitter layer is comprised of a multi-layer structure, the multi-layer structure being comprised of a lower layer composed of a single crystal silicon of $10^{18}cm^{-3}$ or less and an upper layer formed on the lower layer and comprised of a polysilicon doped with an impurity having high concentration of $1\times10^{20}cm^{-3}$ and more.

6. A method for making a bipolar transistor comprising the steps of:

injecting an impurity into a silicon substrate to form a conductive buried collector;

forming a collector layer over the silicon substrate;

sequentially forming a first insulating layer, a first polysilicon layer, a silicon oxide layer, a first nitride layer and a second polysilicon layer on the collector layer;

defining active and inactive regions using a patterned photoresist layer formed on the second polysilicon layer;

removing layers formed on the first polysilicon layer of the inactive region;

forming a side wall nitride layer at both sides of the layers formed on the active region;

depositing a second insulating layer thereon;

removing the side wall nitride layer and performing an etching to form a trench;

filling an isolation insulating layer into the trench;

polishing the isolation insulating layer up to a surface of the silicon oxide layer;

sequentially forming a second insulating layer on the isolating insulating layer and the silicon oxide layer;

removing the first polysilicon layer and the first insulating layer formed on an inactive region other than an active region defined by the trench;

thermal-oxidizing the collector layer formed on the inactive region to form a thermal oxide layer;

removing the second insulating layer and sequentially forming a third polysilicon, a third insulating layer and a nitride layer;

etching back layers formed on a portion of the first insulating layer to form an opening in the active region;

forming a first side wall on both edges of the opening and removing the first insulating layer;

forming an intrinsic base at a region where the first insulating layer is removed to electrically connect the intrinsic base with an extrinsic base in self-alignment;

forming a second side wall on both sides of the first side wall; and forming an emitter layer on the intrinsic base.

7. The method according to claim 6, wherein the isolation insulating layer is comprised of one of $Si_3N_4$, a polyimide and a silica glass containing boron and phosphorous.

8. The method according to claim 6, wherein the emitter layer is comprised of a single-layer polysilicon layer doped with an impurity having high concentration of $1\times10^{20}\text{cm}^{-3}$ or more.

9. The method according to claim 6, wherein the emitter layer is comprised of a multi-layer structure, the multi-layer structure being comprised of a lower layer composed of a single crystal silicon of $10^{18}\text{cm}^{-3}$ or less and an upper layer formed on the lower layer and comprised of a polysilicon doped with an impurity having high concentration of $1\times10^{20}\text{cm}^{-3}$ and more.

* * * * *